(12) United States Patent
Luo et al.

(10) Patent No.: US 11,693,320 B2
(45) Date of Patent: Jul. 4, 2023

(54) SECONDARY IMAGING OPTICAL LITHOGRAPHY METHOD AND APPARATUS

(71) Applicant: The Institute of Optics and Electronics, The Chinese Academy of Sciences, Sichuan (CN)

(72) Inventors: Xiangang Luo, Sichuan (CN); Changtao Wang, Sichuan (CN); Yanqin Wang, Sichuan (CN); Weijie Kong, Sichuan (CN); Ping Gao, Sichuan (CN); Zeyu Zhao, Sichuan (CN)

(73) Assignee: The Institute of Optics and Electronics, The Chinese Academy of Sciences, Sichuan (CN)

( * ) Notice: Subject to any disclaimer, the term of this patent is extended or adjusted under 35 U.S.C. 154(b) by 492 days.

(21) Appl. No.: 16/631,084

(22) PCT Filed: Sep. 20, 2018

(86) PCT No.: PCT/CN2018/106733
§ 371 (c)(1),
(2) Date: Jan. 14, 2020

(87) PCT Pub. No.: WO2019/114361
PCT Pub. Date: Jun. 20, 2019

(65) Prior Publication Data
US 2020/0150538 A1 May 14, 2020

(30) Foreign Application Priority Data
Dec. 11, 2017 (CN) .......................... 201711316102.4

(51) Int. Cl.
*G03F 7/20* (2006.01)
*G03F 7/30* (2006.01)

(52) U.S. Cl.
CPC .............. *G03F 7/2022* (2013.01); *G03F 7/30* (2013.01)

(58) Field of Classification Search
CPC ........ G03F 7/2022; G03F 7/30; G03F 7/2047; G03F 7/2045; G03F 7/2014
See application file for complete search history.

(56) References Cited

U.S. PATENT DOCUMENTS

| | | |
|---|---|---|
| 8,027,086 B2 | 9/2011 | Guo et al. |
| 2006/0003236 A1 | 1/2006 | Mizutani et al. |

(Continued)

FOREIGN PATENT DOCUMENTS

| | | |
|---|---|---|
| CN | 101371193 A | 2/2009 |
| CN | 102636965 A | 8/2012 |

(Continued)

OTHER PUBLICATIONS

First Office Action for Chinese Patent Application No. 201711316102.4 dated Mar. 30, 2021, 27 pages.

(Continued)

*Primary Examiner* — Daborah Chacko-Davis
(74) *Attorney, Agent, or Firm* — Merchant & Gould P.C.

(57) ABSTRACT

The present disclosure provides a secondary imaging optical lithography method and apparatus. The method includes: contacting a lithography mask plate with a flexible transparent transfer substrate closely, the flexible transparent transfer substrate comprising a first near-field imaging structure having a photosensitive layer; irradiating the photosensitive layer through the lithography mask plate with a first light source, so as to transfer a pattern of the lithography mask plate to the photosensitive layer; coating a device substrate for fabricating devices with a photoresist; contacting the flexible transparent transfer substrate with the photoresist-coated device substrate closely; irradiating the (Continued)

device substrate through the flexible transparent transfer substrate with a second light source, so as to transfer a pattern of the photosensitive layer to the photoresist of the device substrate; and developing the device substrate comprising an exposed photoresist, so as to obtain a device pattern conforming to the pattern of the lithography mask plate.

20 Claims, 4 Drawing Sheets

(56) References Cited

U.S. PATENT DOCUMENTS

| | | |
|---|---|---|
| 2009/0203216 A1 | 8/2009 | Mackey |
| 2010/0033701 A1 | 2/2010 | Lee et al. |
| 2015/0336301 A1* | 11/2015 | Kobrin ............... B29C 39/026 |
| | | 264/219 |

FOREIGN PATENT DOCUMENTS

| | | |
|---|---|---|
| CN | 102859441 A | 1/2013 |
| CN | 102866580 A | 1/2013 |
| CN | 103488059 A | 1/2014 |
| CN | 105171985 A | 12/2015 |
| WO | 03/042748 A1 | 5/2003 |
| WO | 2004/114024 A2 | 12/2004 |
| WO | 2009/094009 A1 | 7/2009 |

OTHER PUBLICATIONS

Extended European Search Report for European Patent Application No. 18888899.4 dated Mar. 10, 2021, 9 pages.
International Search Report and Written Opinion of the International Searching Authority for International Patent Application No. PCT/CN2018/106733 dated Dec. 26, 2018, 9 pages.

* cited by examiner

SECONDARY IMAGING OPTICAL LITHOGRAPHY METHOD AND APPARATUS

CROSS-REFERENCE TO RELATED APPLICATION(S)

This application is a National Stage Application of PCT/CN2018/106733, filed on Sep. 20, 2018, which claims priority to a Chinese Patent Application No. 201711316102.4, filed with the Chinese Patent Office on Dec. 11, 2017 and titled "Secondary imaging optical lithography method and apparatus", and which applications are incorporated herein by reference in their entireties. A claim of priority is made to each of the above disclosed applications.

TECHNICAL FIELD

The present disclosure relates to the field of lithography, and more particularly to a secondary imaging optical lithography method and apparatus, which may have a high resolution and a super resolution by a secondary imaging process.

BACKGROUND

Optical lithography is one of the important technical approaches for micro-nano manufacturing. It is widely used in integrated circuits, optoelectronic devices, new materials manufacturing, biomedical and other fields. The resolution of the projection lithography apparatus depends on the numerical aperture NA of the projection objective and the wavelength w1 of the light source. In order to obtain a high-resolution lithography, the numerical aperture of the projection objective in conventional lithography equipment is getting bigger and bigger. The current NA has become greater than 1. If an immersion objective is used, the NA can be 1.4. The imaging objective of conventional optical lithography has a constraint of resolution diffraction limit, and the line width resolution has a limit of 0.25 times the wavelength of the light source in the immersion material. Therefore, the wavelength of the light source of the high-resolution lithography apparatus is getting shorter and shorter, gradually decreasing from 365 nm to 248 nm, 193 nm, and even an EUV light source (wavelength of about 13 nm) is currently used. High numerical aperture projection objectives and light sources with continuously compressed wavelengths have made the conventional high-resolution projection lithography apparatuses (stepper and scanner of photo lithography) more and more expensive, and the price of a single device is as high as tens of millions to hundreds of millions of dollars.

In addition to projection imaging lithography, the proximity contact lithography apparatus is also widely used in research and industry. However, the proximity contact lithography apparatus faces the following disadvantages: low resolution (about 1 micrometer), contact and friction between mask pattern and hard substrate such as silicon wafer, easily damaged pattern, limited service life, and so on.

Nano-imprint technology has also been developed to achieve low cost, high resolution and efficient nano-fabrication technology. Due to the pattern transfer method of physical extrusion, nano-imprinted imprint templates cannot be compatible with conventional masks, nor with conventional photoresist materials and processes. In addition, the demolding process of nano-imprinting has a great influence on the quality of the pattern transfer, which brings the problems of large number of defects, complex imprint materials and complex processes, and so on.

Surface Plasmon (SP) lithography is a super resolution imaging nano-lithography method proposed by researchers in recent years. It originated from the Perfect lens proposed by Professor Pendry of the Imperial University of England (Pendry J B, Negative Refraction Makes a Perfect Lens. Phys. Rev. Lett. 85, 3966-3969 (2000)). The dielectric constant and magnetic permeability of the perfect lens are both negative, and the evanescent wave component carrying the sub-wavelength structure information of the object can be amplified, so that all the wave vector components can reach the image plane and participate in imaging without missing. In theory, perfect imaging without aberrations and resolution constraints can be achieved. However, there is no such natural material with a negative refractive index in nature. With a metal film having a negative dielectric constant, the surface plasmon wave (SPW) is excited by the incident light of the transverse magnetic polarization state (TM), which may produce super resolution imaging on both sides of the metal film.

Compared with the nano-imprint technology, the photoresist and the photosensitive development process used in SP lithography are compatible with the conventional lithography technology, and there are no problems such as imprint template stripping. However, the SP lithography technology reported has faced the following problems. 1) Since the mask and the hard substrate (thin glass, silicon wafer, and the like), flexible film and the like need to be in close contact during exposure, the mask patterns are prone to contamination and damage, which affects the service life and brings lithographic pattern defects. 2) The mask and the common substrate are both hard materials, even if they are contacted under pressure, the faces of the two cannot be closely matched and tightly fit, and there is inevitably a gap distribution with uneven thickness between the two; however, the contrast and intensity of SP lithography imaging are very sensitive to the gap, which leads to the distribution difference of large area pattern lithography effect, even leads to serious defects. 3) Due to the presence of dust in the lithography environment, it is inevitable that dust particles will be attached to the mask in the process of multiple use, which will affect the close contact between the mask and the substrate, and will also lead to serious problems such as the inhomogeneity of the large area SP lithography pattern, defects and the like.

SUMMARY

In order to at least solve the above technical problems, the present disclosure proposes a secondary imaging optical lithography method and apparatus for achieving high resolution and super resolution by a secondary imaging process.

According to one aspect of the present disclosure, a secondary imaging optical lithography method is proposed, comprising: contacting a lithography mask plate with a flexible transparent transfer substrate closely, the flexible transparent transfer substrate comprising a first near-field imaging structure having a photosensitive layer; irradiating the photosensitive layer of the flexible transparent transfer substrate through the lithography mask plate with a first light source, so as to transfer a pattern of the lithography mask plate to the photosensitive layer of the flexible transparent transfer substrate; coating a device substrate for fabricating devices with a photoresist; contacting the flexible transparent transfer substrate with the photoresist-coated device substrate closely; irradiating the device substrate through the flexible transparent transfer substrate with a second light source, so as to transfer a pattern of the photosensitive layer of the flexible transparent transfer substrate to the photoresist of the device substrate by exposing the photoresist; and developing the device substrate comprising an exposed photoresist, so as to obtain a device pattern conforming to the pattern of the lithography mask plate.

According to another aspect of the present disclosure, a secondary imaging optical lithography apparatus is proposed, comprising: a first transfer device, configured to contact a lithography mask plate with a flexible transparent transfer substrate closely, the flexible transparent transfer substrate comprising a first near-field imaging structure having a photosensitive layer; a first light source, configured to irradiate, at a position where the lithography mask plate is in a close contact with the flexible transparent transfer substrate, the photosensitive layer of the flexible transparent transfer substrate through the lithography mask plate, so as to transfer a pattern of the lithography mask plate to the photosensitive layer of the flexible transparent transfer substrate; a photoresist coating device, configured to coat a device substrate for fabricating devices with a photoresist; a second transfer device, configured to contact the flexible transparent transfer substrate with the photoresist-coated device substrate closely; a second light source, configured to irradiate, at a position where the flexible transparent transfer substrate is in a close contact with the photoresist-coated device substrate, the device substrate through the flexible transparent transfer substrate, so as to transfer a pattern of the photosensitive layer of the flexible transparent transfer substrate to the photoresist of the device substrate by exposing the photoresist; and a development etching device, configured to develop the device substrate comprising the exposed photoresist, so as to obtain a device pattern conforming to the pattern of the lithography mask plate.

By using a photosensitive layer of a low-cost flexible transparent transfer substrate as a pattern transfer structure, hard contact of the mask plate and a hard substrate during exposure is avoided, alleviating contamination and damage for the mask, and increasing the lifetime of the mask. Since the flexible transparent transfer substrate is easily adhered to the mask plate or the device substrate, the gap between them is extremely small and evenly distributed, thus a large-area, high-contrast, uniform lithographic pattern may be obtained. By storing the flexible transparent transfer substrate in a sealed storage device and equipping the lithography apparatus with an air cleaning box, a clean air circulation system, and the like, contamination for the lithography environment may be significantly reduced and dust particles adhered to the mask may be decreased. The flexible transparent transfer substrate may be used at one time to minimize the adverse effects of dust particles on lithography. The flexible transparent transfer substrate is not limited by the thickness, hardness, flexibility, and the like of the device substrate, and may be adhered to the device substrate uniformly and closely, thus getting rid of the strict requirements for the device substrate when using the hard mask to adhere closely to the device substrate.

BRIEF DESCRIPTION OF THE DRAWINGS

The objects, features and advantages of the present disclosure will be described in detail in conjunction with the accompanying drawings.

Figure 1:
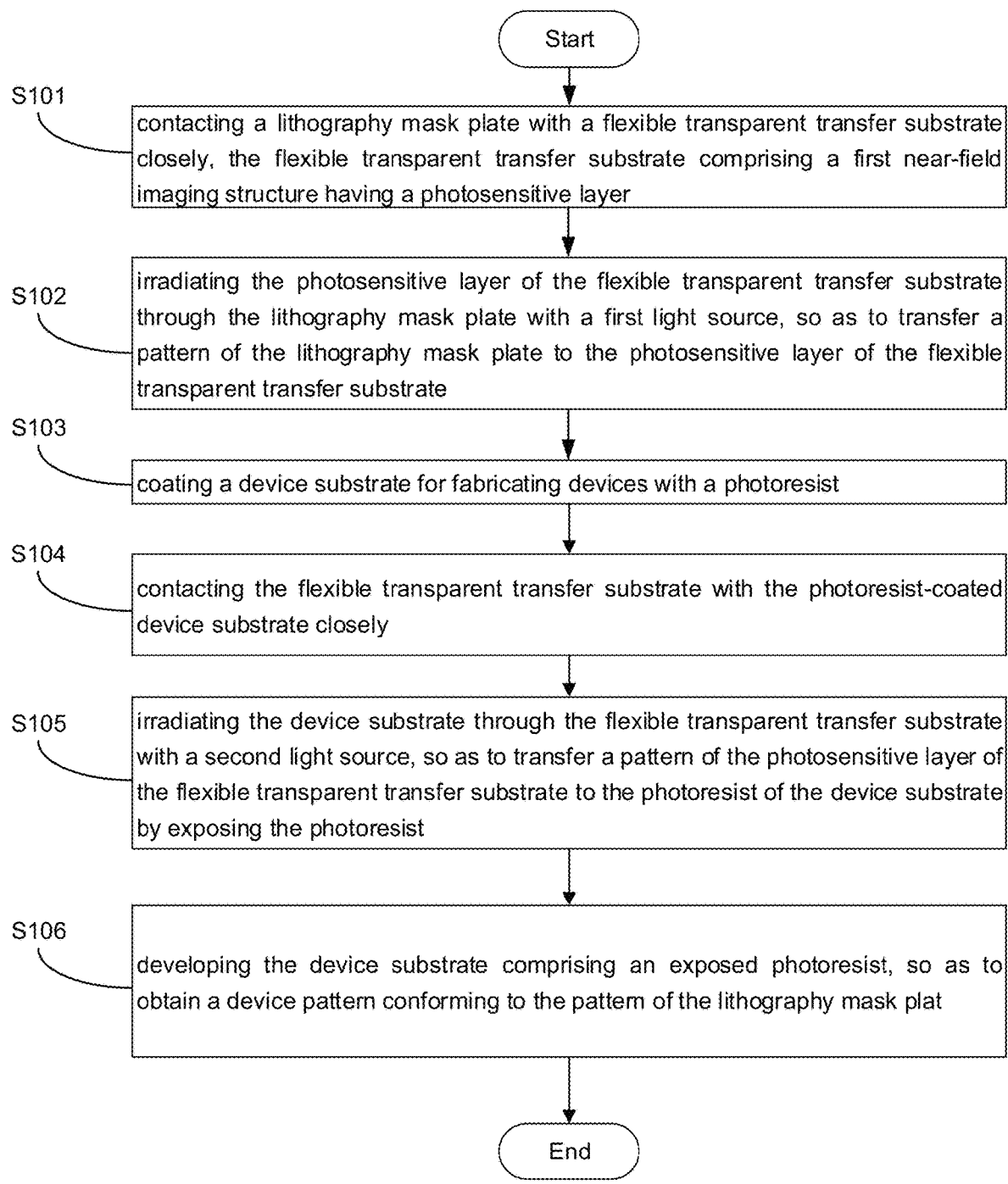
FIG. 1 shows a flow chart of a secondary imaging optical lithography in accordance with an embodiment of the present disclosure.

REFERENCE SIGNS 1 flexible transparent transfer substrate
2 transparent flexible material layer
3 first near-field imaging film layer
4 photosensitive layer
5 transmitted light field of mask
6 mask pattern
7 mask plate substrate
8 first imaging illumination beam
9 sealed cavity
10 pumped-in gas
11 transmitted light field of flexible transparent transfer substrate
12 photoresist layer including a photoresist and a second near-field imaging structure
13 second near-field imaging structure
14 photoresist
15 device substrate
16 second imaging illumination beam
17 clean box or vacuum box
18 first imaging exposure light source
19 alignment and positioning mechanism
20 proximity and contact mechanism
21 wafer stage
22 second imaging exposure light source
23 planar device substrate coated with photoresist
24 curved device substrate coated with photoresist
25-1, 25-2, 25-3 first roller, second roller, third roller
26 roller with a mask pattern on the outer surface
27 photoresist-coated flexible film

DETAILED DESCRIPTION

Embodiments of the present disclosure are now described in detail, and examples thereof are illustrated in the drawings where all the same numbers represent the same elements.

According to the present disclosure, a mask pattern is transferred to a photoresist on the hard substrate through two imaging processes by utilizing a flexible transparent transfer substrate having a photosensitive layer and a near-field imaging layer structure. Thereby, damages to the expensive lithography plate may be reduced, and a large-area, well-distributed, high resolution or even super resolution imaging optical lithography may be realized.

FIG. 1 shows a flow chart of a secondary imaging optical lithography in accordance with an embodiment of the present disclosure. The mask pattern may be transferred to the photoresist in high-resolution or super-resolution, so it may be used in subsequent processing. As shown in FIG. 1, the secondary imaging optical lithography method includes: contacting a lithography mask plate with a flexible transparent transfer substrate closely, the flexible transparent transfer substrate comprising a first near-field imaging structure having a photosensitive layer (S101); irradiating the photosensitive layer of the flexible transparent transfer substrate through the lithography mask plate with a first light source, so as to transfer a pattern of the lithography mask plate to the photosensitive layer of the flexible transparent transfer substrate (S102); coating a device substrate for fabricating devices with a photoresist (S103); contacting the flexible transparent transfer substrate with the photoresist-coated device substrate closely (S104); irradiating the device substrate through the flexible transparent transfer substrate with a second light source, so as to transfer a pattern of the photosensitive layer of the flexible transparent transfer substrate to the photoresist of the device substrate by exposing the photoresist (S105); and developing the device substrate comprising an exposed photoresist, so as to obtain a device pattern conforming to the pattern of the lithography mask plate (S106).

Figure 2:
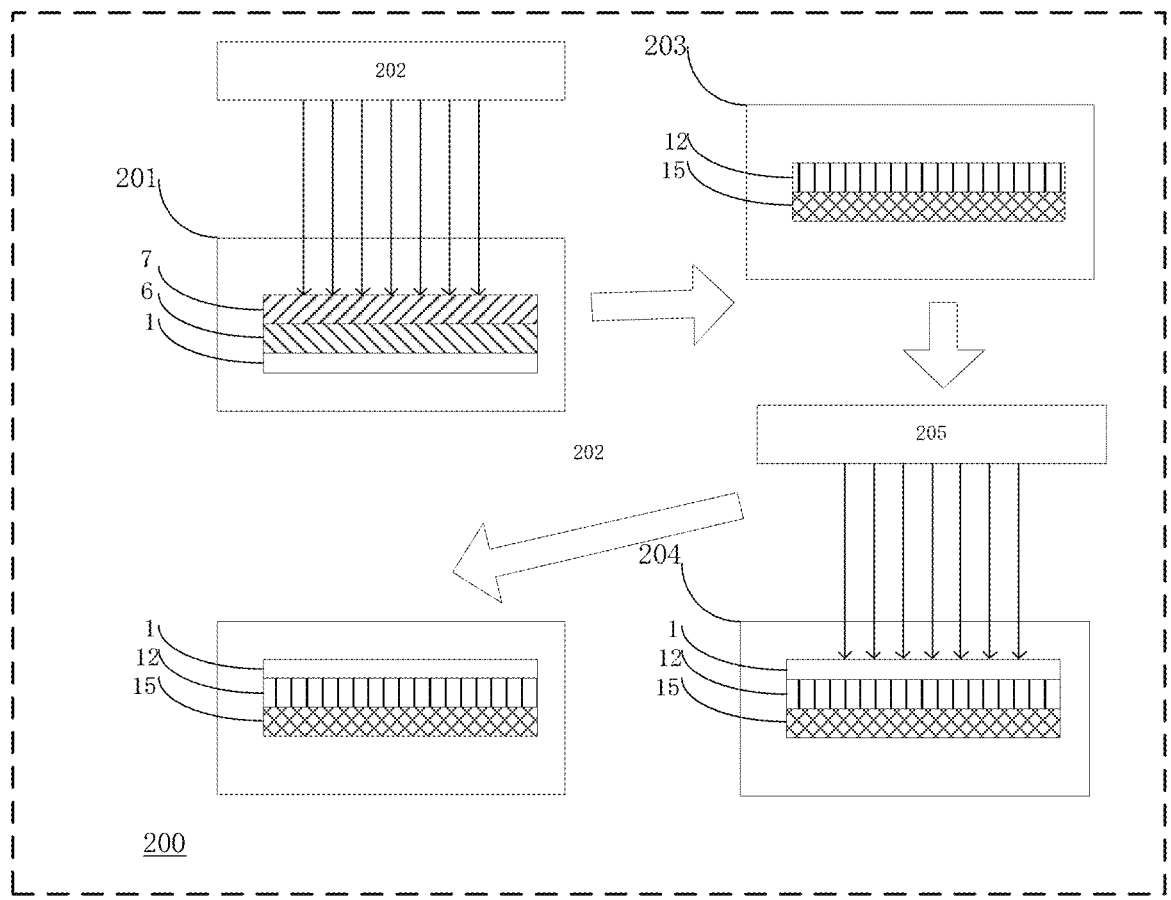
FIG. 2 is a schematic diagram showing the structure of a secondary imaging optical lithography apparatus according to an embodiment of the present disclosure.

FIG. 2 is a schematic diagram showing the structure of a secondary imaging optical lithography apparatus according to an embodiment of the present disclosure. As shown in FIG. 2, the secondary imaging optical lithography apparatus 200 may include: a first transfer device 201, configured to contact a lithography mask plate with a flexible transparent transfer substrate closely, the flexible transparent transfer substrate comprising a first near-field imaging structure having a photosensitive layer; a first light source 202, configured to irradiate, at a position where the lithography mask plate is in a close contact with the flexible transparent transfer substrate, the photosensitive layer of the flexible transparent transfer substrate through the lithography mask plate, so as to transfer a pattern of the lithography mask plate to the photosensitive layer of the flexible transparent transfer substrate; a photoresist coating device 203, configured to coat a device substrate for fabricating devices with a photoresist; a second transfer device 204, configured to contact the flexible transparent transfer substrate with the photoresist-coated device substrate closely; a second light source 205, configured to irradiate, at a position where the flexible transparent transfer substrate is in a close contact with the photoresist-coated device substrate, the device substrate through the flexible transparent transfer substrate, so as to transfer a pattern of the photosensitive layer of the flexible transparent transfer substrate to the photoresist of the device substrate by exposing the photoresist; and a development etching device 206, configured to develop the device substrate comprising the exposed photoresist, so as to obtain a device pattern conforming to the pattern of the lithography mask plate.

When the lithography mask plate is brought into the close contact with the flexible transparent transfer substrate, the side of the hard lithography mask plate having the mask pattern is closely adhered to the side of the flexible transparent transfer substrate having the photosensitive layer. When the flexible transparent transfer substrate is brought into close contact with the photoresist-coated device substrate, the side of the flexible transparent transfer substrate having photosensitive layer is closely adhered to the side of the device substrate having photoresist. After developing the device substrate including the exposed photoresist, it is necessary to etch the developed structure, so as to transfer the pattern onto the substrate, thereby obtaining a device pattern conforming to the pattern of the lithography mask plate.

Figure 3:
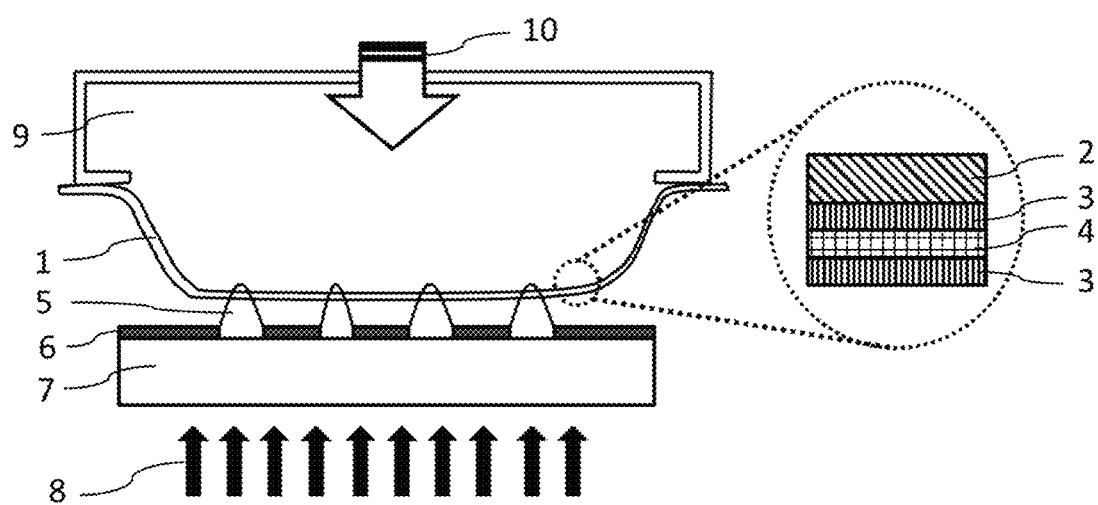
FIG. 3 shows a schematic diagram of a first imaging.

FIG. 3 shows a schematic diagram of the first imaging. As shown in FIG. 3, the flexible transparent transfer substrate 1 is brought into close contact with the surface of the mask pattern 6 by using a pumped-in gas 10. The transmitted light field 5 of the mask pattern 6 is sensed by the photosensitive layer 4 in the flexible transparent transfer substrate 1 when the first imaging illumination beam 8 of the first light source is irradiated, thereby transferring the pattern of the mask pattern 6 to the flexible transparent transfer substrate 1. As shown in the enlarged view on the right side of FIG. 3, in the first near-field imaging structure, the photosensitive layer is interposed between the first near-field imaging layer structures. Specifically, the flexible transparent transfer substrate 1 is formed by processing the surface of the transparent flexible material layer 2 to form sequentially a near-field imaging film layer 3 and a photosensitive layer 4, so that the photosensitive layer 4 is located in a cavity composed of the near-field imaging film layers 3.

In particular, the photosensitive layer is sensitive to the wavelength of the first light source and insensitive to the wavelength of the second light source. The imaging light field of the first light source modulates the transmittance of the photosensitive layer, so as to obtain a pattern of the flexible transparent transfer substrate represented by the transmittance. According to an embodiment of the present disclosure, the photosensitive layer may be composed of a plurality of layers of materials, in order to increase the modulation range of the imaging light field to the transmittance or absorptivity of the photosensitive layer, so that the photosensitive layer can record the mask pattern well. The photosensitive layer is composed of a plurality of layers of materials, wherein the constituent materials of the photosensitive layer include water-soluble diazonium salts, graphene oxide, high energy ion beam bombardment sensitive glass, and so on. Under the first illumination condition E1 of the first light source, the transmittance and/or the refractive index of the irradiated region of the photosensitive layer is required to change significantly; and under the second illumination condition E2 of the second light source, the change in the transmittance and/or the refractive index of the material of the photosensitive layer should be very small, so as to prevent damage to the recorded pattern of the photosensitive layer during the second illumination. The arrangement of the plurality of layers in the photosensitive layer may include an alternate arrangement such as high refractive index/low refractive index/high refractive index, to form a resonant cavity structure, thereby significantly improving the modulation range to the transmittance or absorptivity of the photosensitive layer under the first illumination condition E1. The purpose is to make the transmittance or absorptivity of the irradiated region of the photosensitive layer significantly different from that of the un-irradiated region, improving the fidelity of the recorded pattern of the photosensitive layer.

Specifically, under the irradiation of the first light source, in a case that the distance between the mask pattern and the photosensitive layer is at the near-field interval less than the wavelength of the illumination light, the first near-field imaging structure records the mask pattern in the photosensitive layer by light field imaging. A metal film layer material having a negative dielectric constant at the wavelength of the first light source is disposed on one or both sides of the photosensitive layer to form the first near-field imaging structure, thus the light field carrying detail information of the mask pattern is effectively coupled and amplified into the photosensitive layer, realizing the high resolution and super resolution imaging and recording of the mask pattern in the photosensitive layer. The first near-field imaging structure conveys the mask pattern to the photosensitive layer by light field imaging under the illumination condition E1 of the first light source in a case that the mask plate and the photosensitive layer are at a near-field interval distance, wherein the near-field interval refers to the distance less than the wavelength of the illumination light.

Figure 4:
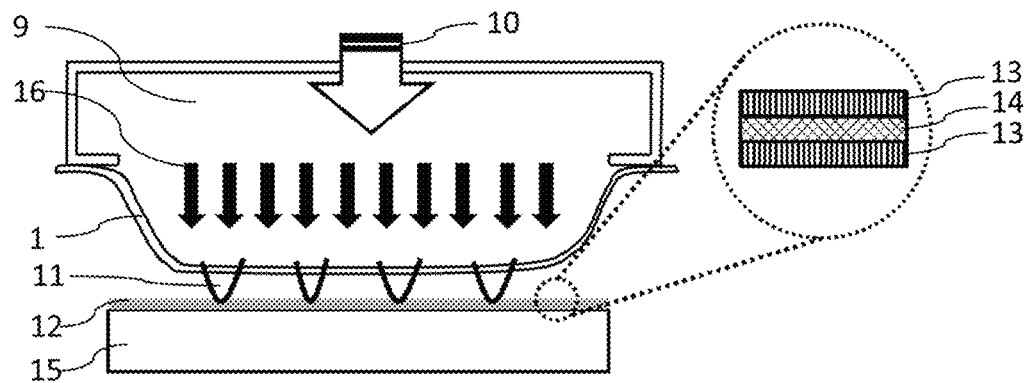
FIG. 4 shows a schematic diagram of a secondary imaging.

FIG. 4 shows a schematic diagram of the second imaging. As shown in FIG. 4, the flexible transparent transfer substrate 1 is brought into close contact with the surface of the photoresist layer 12 including the photoresist and the second near-field imaging structure by the pumped-in gas 10. The transmitted light field 11 of the flexible transparent transfer substrate 1 acts on the photoresist layer 12 including the photoresist and the second near-field imaging structure when the second imaging illumination beam 16 of the second light source is incident, thereby imaging the pattern recorded by the flexible transparent transfer substrate 1 into the photoresist 14. The secondary imaging optical lithography method further includes disposing a second near-field imaging structure on one or both sides of the photoresist. As shown in the enlarged view on the right side of FIG. 4, there are near-field imaging film layers 13 at the upper and lower sides of the photoresist 14. A metal film layer material having a negative dielectric constant at the wavelength of the second light source is disposed on one or both sides of the photoresist material to form the second near-field imaging structure. Such a near-field imaging structure may further improve imaging resolution, depth of focus, and fidelity. The material of the near-field imaging structure may be a metal film layer material having a negative dielectric constant at the wavelength of the illumination condition E2 of the second light source, including and not limited to gold, silver, aluminum, and the like. An imaging structure may be designed on the flexible transparent transfer substrate and the device substrate, so that imaging with a magnification of 1:1 or a reduced magnification may be achieved, an interference imaging effect with periodic patterns may also be achieved. Imaging with a reduced magnification and interference imaging may easily achieve a super resolution imaging effect in the photosensitive layer or photoresist.

Imaging magnification and/or periodic pattern interference can be adjusted by the first near-field imaging structure and/or the second near-field imaging structure. The flexible transparent transfer substrate has a high transmittance under the illumination condition of the second light source. In addition, the flexible transparent transfer substrate should have suitable mechanical properties and thickness, good flexibility and thermal stability, so that the flexible transparent transfer substrate may be well adhered to the mask plate and the hard device substrate, enabling a good uniformity of the gap, thereby achieving a good near-field imaging effect. The flexible transparent transfer substrate has a material including, but not limited to, any of polymethyl methacrylate (PMMA), polydimethylsiloxane (PDMS), polyimide (PI), polyethylene terephthalate (PET), and the like.

There are significant differences in the illumination conditions of the first light source and the second light source, the differences including any one of the following: wavelength, intensity, time, polarization state, direction, and the like. For example, the two illumination conditions E1 and E2 are required to have significant differences, since it is necessary to meet the requirements of the two imaging processes for the illumination conditions respectively, meanwhile it is also necessary to reduce or avoid the mutual interference of the two imaging processes. That is, when the pattern recorded in the photosensitive layer is transferred into the photoresist during the second imaging process, the adverse effect of the second imaging on the photosensitive layer is reduced or avoided, and the distortion resulted from transferring the mask pattern to the photoresist can be reduced. The differences in illumination conditions is aimed to ensure that, under the illumination condition E1, the mask pattern may be effectively recorded in the photosensitive layer of the flexible transparent transfer substrate; and under the illumination condition E2, the photosensitive layer of the flexible transparent transfer substrate is capable of producing a bright-dark distribution of light field conforming to the mask pattern, thereby imaging in the photoresist on the hard substrate. In addition, under the condition of illumination condition E2, the photosensitive layer of the flexible transparent transfer substrate should have no obvious image information change and degradation during multiple use.

After transferring the pattern of the lithography mask plate to the photosensitive layer of the flexible transparent transfer substrate, post-illumination treatment on the flexible transparent transfer substrate is performed to strengthen and cure the recording effect of the mask pattern in the photosensitive layer. The post-illumination treatment may include heating or annealing. In addition, the post-illumination treatment may alleviate the degradation of the pattern recorded by the photosensitive layer.

The photoresist layer has a material including any one of: a photoresist, a refractive index light modulating material, and an absorptivity light modulating material. That is, the photoresist layer may be replaced with other types of photosensitive materials. According to necessary processing, micro-nano structure processing on a hard device substrate in a non-morphological form may be achieved with the photosensitive material.

Figure 5:
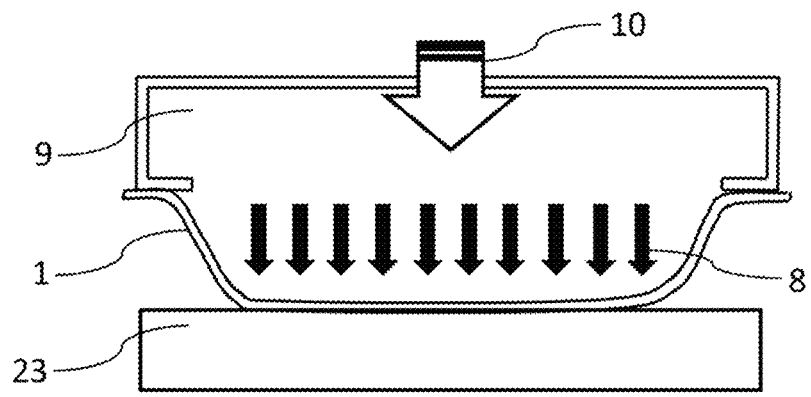
FIG. 5 shows a schematic diagram of a flexible surface-planar surface operation mode of the secondary imaging optical lithography.

FIG. 5 shows a schematic diagram of a flexible surface-planar surface operation mode of secondary imaging optical lithography. As shown in FIG. 5, the surface of the device substrate 23 is a planar surface. In the two imaging processes, the flexible transparent transfer substrate is in close contact with the lithography mask plate and the hard device substrate 23, and then the imaging operation is performed, respectively. Finally, the mask pattern is transferred to the photoresist of the planar hard device substrate, thus achieving 1:1 magnification imaging or interference imaging. In the planar imaging operation mode, a flexible transparent transfer substrate 1 including a photosensitive layer is placed on a photoresist-coated planar device substrate 23 for exposure and imaging.

Figure 6:
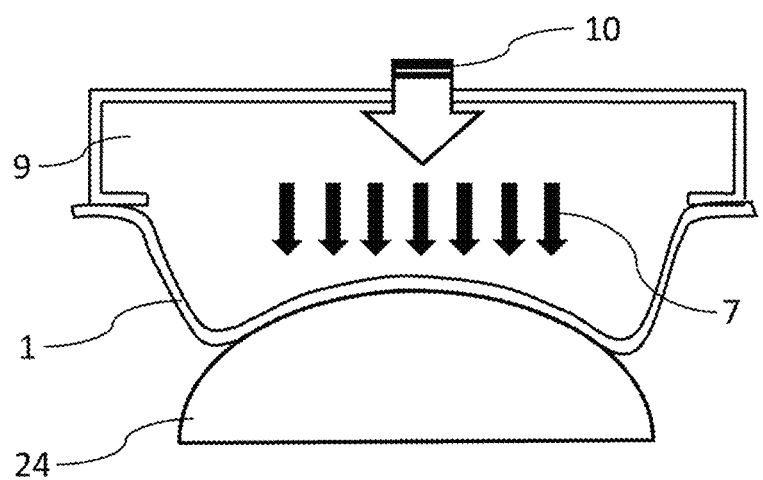
FIG. 6 shows a schematic diagram of a flexible surface-curved surface operation mode of the secondary imaging optical lithography.

FIG. 6 shows a schematic diagram of a flexible surface-curved surface operation mode of secondary imaging optical lithography. As shown in FIG. 6, the surface of the device substrate 24 may be a curved surface. The surface of the device substrate 24 is coated with a photoresist, and a flexible transparent transfer substrate 1 including a photosensitive layer is closely and uniformly contacted with the curved device substrate 24, and the mask pattern is transferred to the photoresist of the curved device substrate. This imaging method may achieve imaging with reduced magnification.

Figure 7:
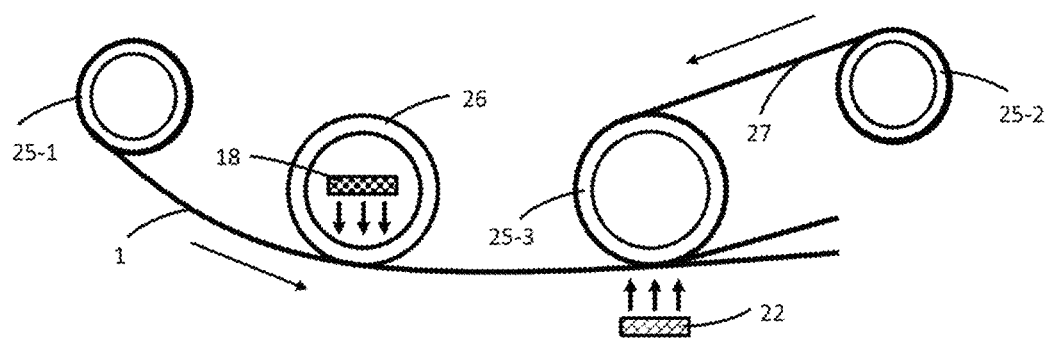
FIG. 7 shows a schematic diagram of a roller-roller operation mode of the secondary imaging optical lithography.

FIG. 7 shows a schematic diagram of a roller-roller operation mode of secondary imaging optical lithography. As shown in FIG. 7, in the roller-roller imaging operation mode, a flexible transparent transfer substrate 1 including a photosensitive layer, and a photoresist-coated flexible film 27 are wound around two rollers 25-1, 25-2, respectively. The lithography mask plate is fabricated on the surface of the roller 26, and a first imaging exposure light source 18 is disposed inside the roller 26 for transferring the mask pattern on the surface of the roller 26 to the photosensitive layer of the flexible transparent transfer substrate 1, achieving the first imaging. The flexible transparent transfer substrate 1 including the exposed photosensitive layer is closely adhered to the photoresist-coated flexible transfer substrate 27 by the roller 25-3. Under the illumination of the second imaging exposure light source 22, the pattern recorded by the photosensitive layer is transferred to the photoresist, thus achieving the secondary imaging. Finally, the photoresist flexibility film recording the mask pattern is obtained, which can be used in the subsequent processing process. That is, the lithography mask plate is disposed at an outer surface of a first roller, and the first roller is internally provided with the first light source, the un-exposed flexible transparent transfer substrate is wound on a source roller, the exposed flexible transparent transfer substrate is wound on a first accommodating roller, and a photoresist-coated flexible device substrate is wound on a second accommodating roller, the method further includes: by rolling the source roller, the first roller, the first accommodating roller, and the second accommodating roller sequentially, transferring the pattern of the lithography mask plate to the flexible transparent transfer substrate after irradiating an unfolded and unexposed flexible transparent transfer substrate with the first light source, and transferring the pattern of the flexible transparent transfer substrate to the flexible device substrate after irradiating the photoresist-coated device substrate through the pattern of the flexible transparent transfer substrate with the second light source. Through the rotation of the rollers, the mask pattern is sequentially imaged on the flexible transparent transfer substrate and the photoresist-coated flexible device substrate, thereby achieving the transfer of the mask pattern synchronously.

In the curved surface imaging operation mode and the roller-roller imaging operation mode shown in FIG. 6 and FIG. 7, the curved surface imaging operation mode is to adhere the flexible transparent transfer substrate 1 including the photosensitive layer closely to the curved device substrate 24 coated with the photoresist to achieve the exposure imaging, and the roller-roller imaging operation mode enables continuous operation of the first imaging on the photosensitive layer in the flexible transparent transfer substrate and the secondary imaging on the photoresist of the device substrate by the coordinated operation of the rollers.

Figure 8:
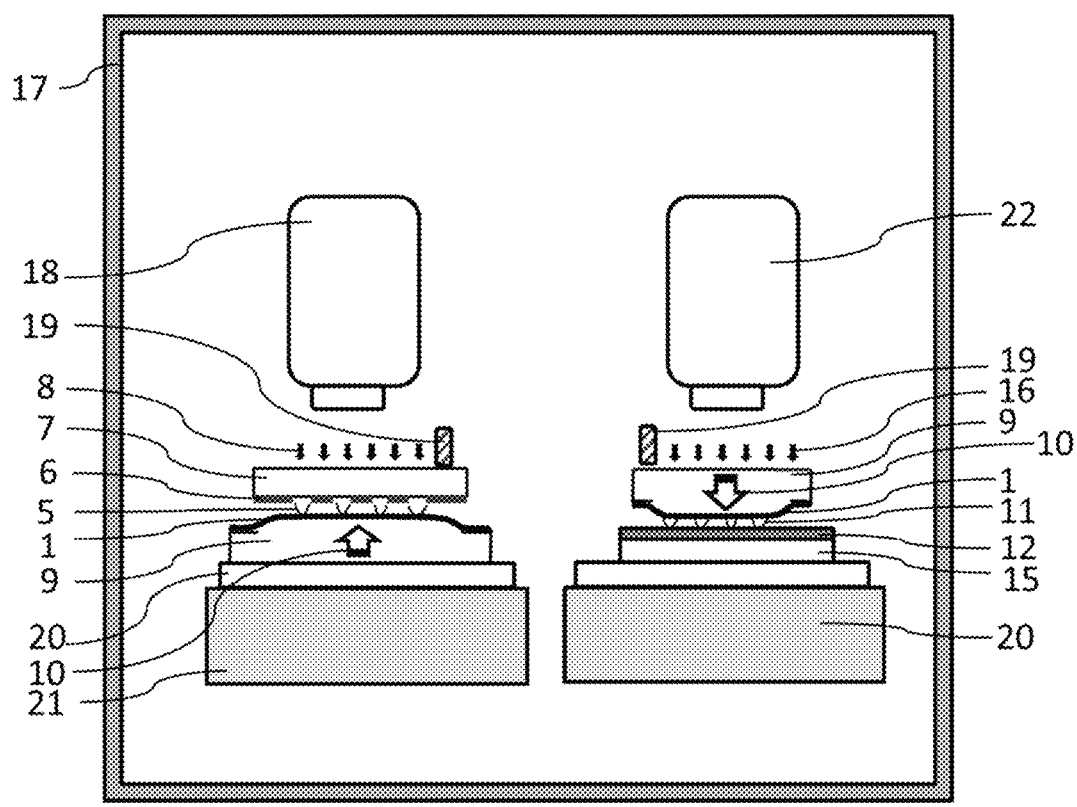
FIG. 8 shows an exemplary structural diagram of a secondary imaging optical lithography apparatus.

FIG. 8 shows an exemplary structural diagram of a secondary imaging optical lithography apparatus. As shown in FIG. 8, the secondary imaging optical lithography apparatus includes: a clean box or vacuum box 17, a first imaging exposure light source 18, a second imaging exposure light source 22, an alignment and positioning mechanism 19, a proximity and contact mechanism 20, a wafer stage 21, a device substrate and a flexible transparent transfer substrate.

The secondary imaging optical lithography apparatus according to an embodiment of the present disclosure may further include a sealed storage device, wherein the flexible transparent transfer substrate is disposed in the sealed storage device. In addition, the secondary imaging optical lithography apparatus according to an embodiment of the present disclosure may further include a flexible film pressing device that enable the close contact by vacuum suction or aerated flexible film contact. The secondary imaging optical lithography apparatus according to an embodiment of the present disclosure may further include a vacuum device, wherein the close contact is performed in a vacuum environment created by the vacuum device. Vacuum adsorption is to evacuate the air in the gap between the flexible film and the mask/the hard substrate, and press them under external atmospheric pressure. Aerated flexible film contact is to apply pressure to the flexible film by gas blowing, so that the flexible film is in close contact with the mask or the hard substrate. It is also possible to dispose a substrate gap non-uniformity and bubble detection mechanism to monitor on-line the state of close contact and possible defects during the two imaging processes for real-time feedback. By adjusting the control system to restore the uniformity of the substrate gap, the high quality lithography results may be obtained continuously.

The lithography apparatus according to embodiments of the present disclosure may further include: a light source and illumination system, a proximity and contact mechanism, an alignment and positioning mechanism, a storage and accommodating mechanism for the flexible transparent film materials, related detection and control mechanisms, and the like. The function of the proximity and contact mechanism is to level the mask plate and the substrate to achieve uniform contact. The function of the alignment and positioning mechanism is to position the substrate mark and align with the mask pattern. The related detection and control mechanisms include a substrate particle detection mechanism, a substrate gap non-uniformity and bubble detection mechanism, an air cleaning box, a clean air circulation system, and the like. The light sources of the two illumination conditions disposed in the lithography apparatus correspond to the illumination condition E1 and the illumination condition E2, respectively. Additionally, to avoid dust particle contamination, the lithography apparatus may be equipped with a sealed storage device for the unexposed flexible transparent transfer substrate. In addition, the number of uses of the flexible transparent transfer substrate may be limited in accordance with wear, dust particle contamination, and the like, as well as requirements for image quality. For example, a disposable flexible transparent transfer substrate may be adopted to minimize contamination of dust particles in the air and optimize the quality of the imaging. In addition, there is a certain requirement on the outer surface of the photosensitive layer side of the flexible transparent transfer substrate and the outer surface of the photoresist side of the device substrate, so as to strictly control the surface roughness, particles, scratches, and the like. Thus, it is ensured that the photosensitive layer of the flexible transparent transfer substrate is in close and uniform contact with the mask plate or the hard substrate during the two imaging processes to reduce defects. For example, the surface control method may include filtering out the undissolved solute particles in the photosensitive layer material and the photoresist solution as much as possible, strictly controlling the cleanliness of the surrounding environment when coating the film layer, properly storing and using the surfaces, and the like.

The lithography apparatus may include an air cleaning box, a clean air circulation system, and the like to maintain high air cleanliness in the lithography environment. The imaging lithography area may be equipped with a cleanliness detection mechanism and a flexible transparent transfer substrate surface dust particle detecting mechanism to monitor on-line and timely feedback the cleanliness of the imaging lithography area, so as to facilitate adjustment of the relevant system, so that the air cleanliness of the imaging lithography area meets the lithography requirements.

The implementation process of the secondary imaging lithography method of the present disclosure will be specifically described below with reference to FIGS. 1, 2 and 8. Firstly, PDMS with smooth surface was adopted as the first imaging flexible transparent transfer substrate; then a silver film with a thickness of 20 nm was evaporated on the PDMS; and the surface of the obtained silver film was spin-coated with a water-soluble diazonium salt (p-diazodiphenylamine chloride zinc chloride, DZS) film layer with a thickness of 50 nm; a silver film having a thickness of 20 nm was evaporated on the surface of the DZS film layer; a chrome mask plate having a period of 128 nm, a duty ratio of 0.7, and a thickness of 40 nm was placed on and adhered to the flexible transparent transfer substrate; an ultraviolet LED with a center wavelength of 365 nm and a light intensity of 100 mW/cm$^2$ was adopted as the first light source, and the exposure was performed at the chrome mask plate side with an exposure time of 25 s to make the DZS film layer in the flexible transparent transfer substrate to be exposed; a silicon substrate with a small surface roughness was adopted as a device substrate for the second imaging; a silver film having a thickness of 50 nm was sputtered on the surface of the silicon substrate; the surface of the obtained silver film was spin-coated with a photoresist AR3170 having a thickness of 30 nm; a silver film having a thickness of 20 nm was evaporated on the surface of the obtained photoresist AR3170; the obtained flexible transparent transfer substrate was placed on and adhered to the device substrate for the secondary imaging, with the silver surface of the flexible transparent transfer substrate contact with the silver surface of the device substrate for the secondary imaging; an ultraviolet LED having a center wavelength of 365 nm and a light intensity of 1 mW/cm$^2$ was adopted as the second light source, and the exposure was performed from the flexible transparent transfer substrate side for an exposure time of 12 s to transfer the pattern recorded by the flexible transparent transfer substrate to the photoresist; the flexible transparent transfer substrate was removed; the silver film on the surface of the photoresist on the device substrate for the second imaging was peeled off with a tape; the obtained structure was placed into the AZ300 developer for developing treatment with a development time of 20 s, and the developed structure was blown dry; a periodic grating structure was obtained on the photoresist with a period of 128 nm and a line width of 64 nm; a subsequent etching treatment was performed to obtain a desired pattern on the surface of the device substrate.

By using a photosensitive layer of a low-cost flexible transparent transfer substrate as a pattern transfer structure, hard contact of the mask plate and the hard substrate during exposure is avoided, mask contamination and damage are alleviated, and the lifetime of the mask is increased. Since the flexible transparent transfer substrate is easily adhered to the mask plate or the device substrate, the gap between them is extremely small and evenly distributed, so that a large-area, high-contrast, uniform lithographic pattern may be obtained. By storing the flexible transparent transfer substrate in a sealed storage device and equipping the lithography apparatus with an air cleaning box, a clean air circulation system, and the like, contamination of the lithography environment may be significantly reduced and dust particles adhering to the mask may be reduced. The flexible transparent transfer substrate may be used at one time to minimize the adverse effects of dust particles on lithography. The flexible transparent transfer substrate is not limited by the thickness, hardness, flexibility, and the like, of the device substrate, and may be adhered to the device substrate uniformly and closely, thus getting rid of the strict requirements for the device substrate when using the hard mask to adhere closely to the device substrate.

Although the present disclosure has been specifically shown and described with reference to the typical embodiments thereof, it will be understood by those skilled in the art that various changes to those embodiments in form and detail may be made without departing from the spirit and scope of the present disclosure as defined by the appended claims.

We claim:

1. A secondary imaging optical lithography method comprising:
    contacting a lithography mask plate with a flexible transparent transfer substrate closely, the flexible transparent transfer substrate comprising a first near-field imaging structure having a photosensitive layer;
    irradiating the photosensitive layer of the flexible transparent transfer substrate through the lithography mask plate with a first light source, so as to transfer a pattern of the lithography mask plate to the photosensitive layer of the flexible transparent transfer substrate;
    coating a device substrate for fabricating devices with a photoresist;
    contacting the flexible transparent transfer substrate with the photoresist-coated device substrate closely;
    irradiating the device substrate through the flexible transparent transfer substrate with a second light source, so as to transfer a pattern of the photosensitive layer of the flexible transparent transfer substrate to the photoresist of the device substrate by exposing the photoresist; and
    developing the device substrate comprising an exposed photoresist, so as to obtain a device pattern conforming to the pattern of the lithography mask plate,
    wherein the photosensitive layer is composed of layers of materials, an arrangement of the layers in the photosensitive layer an alternate arrangement as high refractive index/low refractive index/high refractive index, to form a resonant cavity structure,
    wherein the pattern of the lithography mask plate is recorded in the photosensitive layer irradiated by the first light source by light field imaging, in response to a distance between the lithography mask plate and the photosensitive layer belonging to a near-field interval less than a wavelength of the first light source.

2. The secondary imaging optical lithography method according to claim 1, wherein the photosensitive layer is sensitive to a wavelength of the first light source and insensitive to a wavelength of the second light source.

3. The secondary imaging optical lithography method according to claim 1, wherein the first light source has an imaging light field which modulates a transmittance of the photosensitive layer, so as to obtain the pattern of the photosensitive layer of the flexible transparent transfer substrate represented by the transmittance.

4. The secondary imaging optical lithography method according to claim 1, wherein the photosensitive layer has a constituent material comprising any of water-soluble diazonium salts, graphene oxide, and high energy ion beam bombardment sensitive glass.

5. The secondary imaging optical lithography method according to claim 1, wherein the photosensitive layer is interposed between near-field imaging layers of the first near-field imaging structure.

6. The secondary imaging optical lithography method according to claim 1, wherein the first near-field imaging structure is formed by disposing a metal film layer material having a negative dielectric constant at a wavelength of the first light source on one or both sides of the photosensitive layer.

7. The secondary imaging optical lithography method according to claim 1, further comprising disposing a second near-field imaging structure on one or both sides of the photoresist.

8. The secondary imaging optical lithography method according to claim 7, wherein the second near-field imaging structure is formed by disposing a metal film layer material having a negative dielectric constant at a wavelength of the second light source on one or both sides of the photoresist.

9. The secondary imaging optical lithography method according to claim 1, wherein imaging magnification and/or periodic pattern interference is adjusted by the first near-field imaging structure.

10. The secondary imaging optical lithography method according to claim 1, wherein the flexible transparent transfer substrate has a high transmittance at the wavelength of the second light source.

11. The secondary imaging optical lithography method according to claim 10, wherein the flexible transparent transfer substrate has a material comprising any of: polymethyl methacrylate, polydimethylsiloxanes, polyimides, polyethylene terephthalates.

12. The secondary imaging optical lithography method according to claim 1, wherein the irradiation of the first light source differs from the irradiation of the second light source in any of wavelength, intensity, time, polarization state, and direction.

13. The secondary imaging optical lithography method according to claim 1, further comprising: after transferring the pattern of the lithography mask plate to the photosensitive layer of the flexible transparent transfer substrate, performing a post-illumination process on the flexible transparent transfer substrate, so as to enhance and cure a recording effect of the pattern in the photosensitive layer.

14. The secondary imaging optical lithography method according to claim 13, wherein the post-illumination process comprises heating.

15. The secondary imaging optical lithography method according to claim 1, wherein the photoresist has a material comprising any of a photoresist, a refractive index optical modulated material, and an absorptivity optical modulated material.

16. The secondary imaging optical lithography method according to claim 1, wherein surfaces of the lithography mask plate and the device substrate are both planar, or a surface of the device substrate is a curved surface.

17. The secondary imaging optical lithography method according to claim 1, wherein the lithography mask plate is disposed at an outer surface of a first roller, and the first light source is disposed inside the first roller, an unexposed flexible transparent transfer substrate is wound on a source roller, an exposed flexible transparent transfer substrate is wound on a first accommodating roller, and the photoresist-coated device substrate is wound on a second accommodating roller, the method further comprises: by rolling the source roller, the first roller, the first accommodating roller, and the second accommodating roller sequentially, transferring the pattern of the lithography mask plate to the flexible transparent transfer substrate after irradiating an unfolded and unexposed flexible transparent transfer substrate with the first light source, and transferring the pattern of the exposed flexible transparent transfer substrate to the photoresist-coated flexible device substrate after irradiating the photoresist-coated device substrate through the pattern of the exposed flexible transparent transfer substrate with the second light source.

18. The secondary imaging optical lithography method according to claim 1, wherein the flexible transparent transfer substrate is disposed in a sealed storage device.

19. The secondary imaging optical lithography method according to claim 1, wherein the contacting is achieved by vacuum adsorption or aerated flexible film contact.

20. The secondary imaging optical lithography method according to claim 1, wherein the contacting is performed in a vacuum environment.

* * * * *